US012738212B2

(12) United States Patent
Kang et al.

(10) Patent No.: US 12,738,212 B2
(45) Date of Patent: Sep. 15, 2026

(54) RATED VOLTAGE TRANSFER LINE, RATED VOLTAGE TRANSFER SYSTEM INCLUDING THE SAME, AND ELECTRONIC DEVICE INCLUDING THE SAME

(71) Applicant: Samsung Display Co., Ltd., Yongin-Si (KR)

(72) Inventors: Deokho Kang, Yongin-si (KR); Min-Woo Kim, Yongin-si (KR); Yeon-Sun Na, Yongin-si (KR); Kyunghwan Moon, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 19/226,146

(22) Filed: Jun. 3, 2025

(65) Prior Publication Data

US 2026/0038432 A1 Feb. 5, 2026

(30) Foreign Application Priority Data

Jul. 31, 2024 (KR) ........................ 10-2024-0101704

(51) Int. Cl.
*G09G 3/3208* (2016.01)
*G09G 3/20* (2006.01)
*H10K 59/131* (2023.01)

(52) U.S. Cl.
CPC ............ *G09G 3/3208* (2013.01); *G09G 3/20* (2013.01); *G09G 2300/0426* (2013.01); *G09G 2310/08* (2013.01); *G09G 2330/021* (2013.01); *G09G 2330/028* (2013.01); *H10K 59/131* (2023.02)

(58) Field of Classification Search
CPC ................... G09G 3/3208; G09G 3/20; G09G 2300/0426; G09G 2310/08; G09G 2330/021; G09G 2330/028; H10K 59/131
See application file for complete search history.

(56) References Cited

U.S. PATENT DOCUMENTS

| | | | | |
|---|---|---|---|---|
| 6,191,647 | B1 | 2/2001 | Tanaka et al. | |
| 12,340,741 | B2 * | 6/2025 | Kim | G09G 3/3225 |
| 2024/0233632 | A1 * | 7/2024 | Kim | G09G 3/3225 |
| 2025/0292732 | A1 * | 9/2025 | Kim | G09G 3/3225 |

FOREIGN PATENT DOCUMENTS

| | | | |
|---|---|---|---|
| KR | 10-2024-0110184 | A | 7/2024 |

* cited by examiner

*Primary Examiner* — Adam J Snyder
(74) *Attorney, Agent, or Firm* — Innovation Counsel LLP

(57) ABSTRACT

A rated voltage transfer line includes: a rated voltage applied portion to which a first rated voltage is applied; at least one capacitor including a first terminal connected to the rated voltage applied portion and a second terminal grounded; a first rated voltage transfer electrode which electrically contacts the rated voltage applied portion at a first point; a second rated voltage transfer electrode which electrically contacts the rated voltage applied portion at a second point different from the first point; a first sub-line electrically connected to the first rated voltage transfer electrode; and a second sub-line electrically connected to the second rated voltage transfer electrode.

20 Claims, 13 Drawing Sheets

FIG. 2

TIMING CONTROLLER
200
BLK2_1
BLK2_2
...
BLK2_j
BLK2
BLK1_1
BLK1_2
...
BLK1_i
BLK1
CL
POWER NET
PS1_1
...
PS1_m
PS2_1
...
PS2_n
PS1
100
PS2
SYS

CAP
CL
CP
CP_BR1
CP_BR2
NVP2
NVP1
SL1
SL1_BR
CTA1
CT1
CTA2
CT2
SL2_BR
SL2
NVP:NVP1,NVP2

RATED VOLTAGE TRANSFER LINE, RATED VOLTAGE TRANSFER SYSTEM INCLUDING THE SAME, AND ELECTRONIC DEVICE INCLUDING THE SAME

CROSS-REFERENCE TO RELATED APPLICATION

This application claims priority under 35 USC § 119 to Korean Patent Application No. 10-2024-0101704, filed on Jul. 31, 2024, in the Korean Intellectual Property Office, the content of which is herein incorporated by reference in its entirety.

BACKGROUND

1. Field

The present disclosure relates generally to a rated voltage transfer line for a display device. More particularly, the present disclosure relates to a rated voltage transfer line for a display device, a rated voltage transfer system including the rated voltage transfer line, and an electronic device including the rated voltage transfer line.

2. Description of the Related Art

A display device is a device that displays an image, and may include a pixel that emits light and a driving unit for driving the pixel. The driving unit may include at least one driver for generating a driving signal and a timing controller for generating a driving control signal for driving the driver.

The timing controller may include a plurality of blocks that generate the driving control signal. The plurality of blocks may generate different types of drive control signals.

To generate the driving control signal in the timing controller, power needs to be supplied to the timing controller. For this purpose, the display device may further include a power net for supplying power to the timing controller. The power net may include a plurality of power sources, and each of the plurality of power sources may generate power.

SUMMARY

Embodiments provide a rated voltage transfer line capable of improving display quality.

Embodiments provide a rated voltage transfer system including the rated voltage transfer line.

Embodiments provide an electronic device including the rated voltage transfer line.

A rated voltage transfer line according to an embodiment of the present disclosure includes: a rated voltage applied portion to which a first rated voltage is applied; at least one capacitor including a first terminal connected to the rated voltage applied portion and a second terminal grounded; a first rated voltage transfer electrode which electrically contacts the rated voltage applied portion at a first point; a second rated voltage transfer electrode which electrically contacts the rated voltage applied portion at a second point different from the first point; a first sub-line electrically connected to the first rated voltage transfer electrode; and a second sub-line electrically connected to the second rated voltage transfer electrode.

In an embodiment, the first point and the second point may be spaced apart from each other by the at least one capacitor.

In an embodiment, the first sub-line and the second sub-line may be spaced apart from each other.

In an embodiment, the rated voltage transfer line may further include a first contact portion electrically connected to the first sub-line and a second contact portion electrically connected to the second sub-line.

In an embodiment, a noise transfer path through which a noise applied to the first contact portion is transferred to the second contact portion may be defined. The noise transfer path may include a path passing through a third point of the rated voltage applied portion which electrically contacts the at least one capacitor.

In an embodiment, the noise transfer path may include a first noise transfer path in which the noise applied to the first contact portion is transferred to the rated voltage applied portion and a second noise transfer path in which the noise is transferred from the rated voltage applied portion to the second contact portion.

In an embodiment, the noise may be transferred to the second contact portion passing through the third point which electrically contacts the at least one capacitor in the second noise transfer path.

In an embodiment, a first voltage transfer path may be defined as a path through which the first rated voltage output from the rated voltage applied portion is transferred to the first contact portion. A second voltage transfer path may be defined as a path through which the first rated voltage output from the rated voltage applied portion is transferred to the second contact portion. Each of a length of the first voltage transfer path and a length of the second voltage transfer path may be smaller than a length of the noise transfer path.

In an embodiment, the rated voltage transfer line may further include a first bridge electrode which is arranged between the first contact portion and the first sub-line and electrically connects the first contact portion and the first sub-line and a second bridge electrode which is arranged between the second contact portion and the second sub-line and electrically connects the second contact portion and the second sub-line.

In an embodiment, the rated voltage transfer line may further include a plurality of capacitors including the at least one capacitor, and the plurality of capacitors may be repeatedly arranged along a length direction of the rated voltage applied portion.

In an embodiment, the at least one capacitor may include at least one first capacitor arranged on a first side of the rated voltage applied portion and at least one second capacitor arranged on a second side opposite to the first side of the rated voltage applied portion.

In an embodiment, the first point and the second point may be spaced apart from each other by the at least one first capacitor and the at least one second capacitor.

In an embodiment, the rated voltage transfer line may further include a first contact portion electrically connected to the first sub-line and a second contact portion electrically connected to the second sub-line. A noise transfer path through which a noise applied to the first contact portion is transferred to the second contact portion is defined. The noise transfer path may include a path passing through a third point of the rated voltage applied portion which electrically contacts the at least one first capacitor and a fourth point of the rated voltage applied portion which electrically contacts the at least one second capacitor.

A rated voltage transfer system according to an embodiment of the present disclosure includes: a power net including a first power source which provides a first rated voltage; a timing controller including a first block and a second block which are driven by the first rated voltage; and a rated voltage transfer line which electrically connects the first power source to each of the first block and the second block. The rated voltage transfer line includes: a rated voltage applied portion receiving the first rated voltage from the first power source; at least one capacitor including a first terminal connected to the rated voltage applied portion and a second terminal grounded; a first rated voltage transfer electrode which electrically contacts the rated voltage applied portion at a first point; a second rated voltage transfer electrode which electrically contacts the rated voltage applied portion at a second point different from the first point; a first sub-line electrically connected to the first rated voltage transfer electrode; and a second sub-line electrically connected to the second rated voltage transfer electrode.

In an embodiment, the first point and the second point of may be spaced apart from each other by the at least one capacitor.

In an embodiment, the first sub-line and the second sub-line may be spaced apart from each other.

In an embodiment, the rated voltage transfer line may further include a first contact portion electrically connected to the first sub-line and electrically connected to the first block and a second contact portion electrically connected to the second sub-line and electrically connected to the second block.

In an embodiment, a noise transfer path through which a noise applied to the first contact portion is transferred to the second contact portion may be defined. The noise transfer path may include a path passing through a third point of the rated voltage applied portion which electrically contacts the at least one capacitor.

In an embodiment, the noise transfer path may include a first noise transfer path in which the noise applied to the first contact portion is transferred to the rated voltage applied portion and a second noise transfer path in which the noise is transferred from the rated voltage applied portion to the second contact portion. The noise may be transferred to the second contact portion passing through the third point which electrically contacts the at least one capacitor in the second noise transfer path.

In an embodiment, a first voltage transfer path may be defined as a path through which the first rated voltage output from the rated voltage applied portion is transferred to the first contact portion. A second voltage transfer path may be defined as a path through which the first rated voltage output from the rated voltage applied portion is transferred to the second contact portion. Each of a length of the first voltage transfer path and a length of the second voltage transfer path may be smaller than a length of the noise transfer path.

An electronic device according to an embodiment of the present disclosure includes: a power net including a first power source which provides a first rated voltage; a timing controller including a first block and a second block which are driven by the first rated voltage; a processor which transfers an image data signal and an input control signal to the timing controller; and a rated voltage transfer line which electrically connects the first power source to each of the first block and the second block. The rated voltage transfer line includes: a rated voltage applied portion receiving the first rated voltage from the first power source; at least one capacitor including a first terminal connected to the rated voltage applied portion and a second terminal grounded; a first rated voltage transfer electrode which electrically contacts the rated voltage applied portion at a first point; a second rated voltage transfer electrode which electrically contacts the rated voltage applied portion at a second point different from the first point; a first sub-line electrically connected to the first rated voltage transfer electrode; and a second sub-line electrically connected to the second rated voltage transfer electrode.

A rated voltage transfer line according to an embodiment of the present disclosure may include a first rated voltage transfer electrode that electrically contacts a rated voltage applied portion at a first point, a first sub-line electrically connected to the first rated voltage transfer electrode, a first contact portion electrically connected to the first sub-line, a second rated voltage transfer electrode that electrically contacts the rated voltage applied portion at a second point different from the first point, a second sub-line electrically connected to the second rated voltage transfer electrode, and a second contact portion electrically connected to the second sub-line. The rated voltage applied portion may be applied with a first rated voltage and may be connected to at least one capacitor.

A noise applied to the first contact portion may be transferred to the second contact portion passing through the at least one capacitor connected to the rated voltage applied portion. That is, the noise applied to the first contact portion may be transferred to the second contact portion passing through a third point of the rated voltage applied portion that electrically contacts the at least one capacitor. Accordingly, the noise generated between the first contact portion and the second contact portion may be effectively reduced.

BRIEF DESCRIPTION OF THE DRAWINGS

Illustrative, non-limiting embodiments will be more clearly understood from the following detailed description in conjunction with the accompanying drawings.

FIGS. 2 and 3 are diagrams illustrating a rated voltage transfer system according to an embodiment of the present disclosure.

DETAILED DESCRIPTION OF THE EMBODIMENTS

Figure 1:
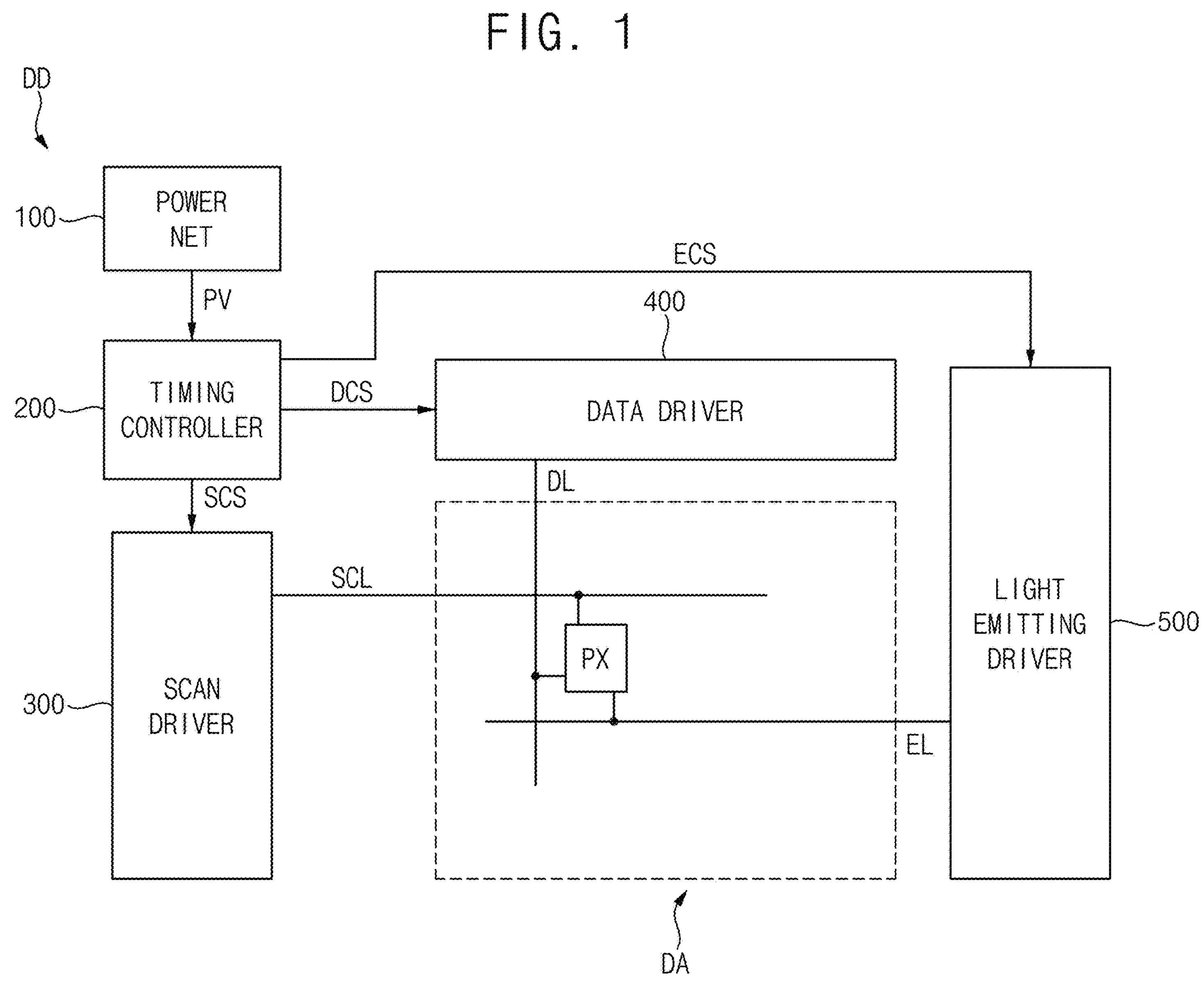
FIG. 1 is a block diagram illustrating a display device according to an embodiment of the present disclosure.

Hereinafter, embodiments of the present disclosure will be described in detail with reference to the accompanying drawings. The same reference numerals are used for the same components in the drawings, and redundant descriptions of the same components will be omitted.

FIG. 1 is a block diagram illustrating a display device DD according to an embodiment of the present disclosure.

Referring to FIG. 1, the display device DD according to an embodiment of the present disclosure may include a power net 100, a timing controller 200, a scan driver 300, a data driver 400, an emission driver 500, and a pixel PX.

The pixel PX may be defined as the smallest unit that emits light. The pixel PX may be arranged in a display area DA. The pixel PX may be provided in plurality, and the plurality of pixels PX may be entirely arranged in the display area DA. For example, each of the pixels PX may include an organic light-emitting element and a pixel driving circuit that is electrically connected to the organic light-emitting element and generates a driving current.

The power net 100 may provide power PV to the timing controller 200. The timing controller 200 may generate a driving control signal by receiving the power PV. The timing controller 200 may provide the driving control signal to each of the scan driver 300, the data driver 400, and the emission driver 500. For example, the timing controller 200 may provide a scan driving control signal SCS to the scan driver 300. The timing controller 200 may provide a data driving control signal DCS to the data driver 400. The timing controller 200 may provide an emission driving control signal ECS to the emission driver 500.

The scan driver 300, the data driver 400, and the emission driver 500 may be arranged around the display area DA. Each of the scan driver 300, the data driver 400, and the emission driver 500 may be electrically connected to the pixel driving circuit, and may provide driving signals to the pixel driving circuit.

Specifically, the scan driver 300 may generate a scan signal based on the scan driving control signal SCS. The scan driver 300 may output the scan signal to a scan line SCL. The scan driver 300 may be electrically connected to the pixel PX through the scan line SCL, and may provide the scan signal to the pixel PX.

The data driver 400 may generate a data signal based on the data driving control signal DCS. The data driver 400 may output the data signal to a data line DL. The data driver 400 may be electrically connected to the pixel PX through the data line DL, and may provide the data signal to the pixel PX.

The emission driver 500 may generate an emission control signal based on the emission driving control signal ECS. The emission driver 500 may output the emission control signal to an emission control line EL. The emission driver 500 may be electrically connected to the pixel PX through the emission control line EL, and may provide the emission control signal to the pixel PX.

Accordingly, the pixel PX may provide the driving current to the organic light-emitting element based on the scan signal, the data signal, and the emission control signal, and light may be emitted from the organic light-emitting element.

Although three types of the drivers 300, 400, and 500 are exemplarily illustrated in FIG. 1, the present disclosure is not limited thereto. For example, the display device DD may include four or more types of drivers for providing the driving signals to the pixel PX.

In addition, although three types of the driving control signals SCS, DCS, and ECS provided by the timing controller 200 are exemplarily illustrated in FIG. 1, the number of the driving control signals provided by the timing controller 200 is not limited thereto. For example, the driving control signals provided by the timing controller 200 may include four or more types of signals. For another example, each of the scan driving control signal SCS, the data driving control signal DCS, and the emission driving control signal ECS may include two or more driving control signals.

Figure 2:
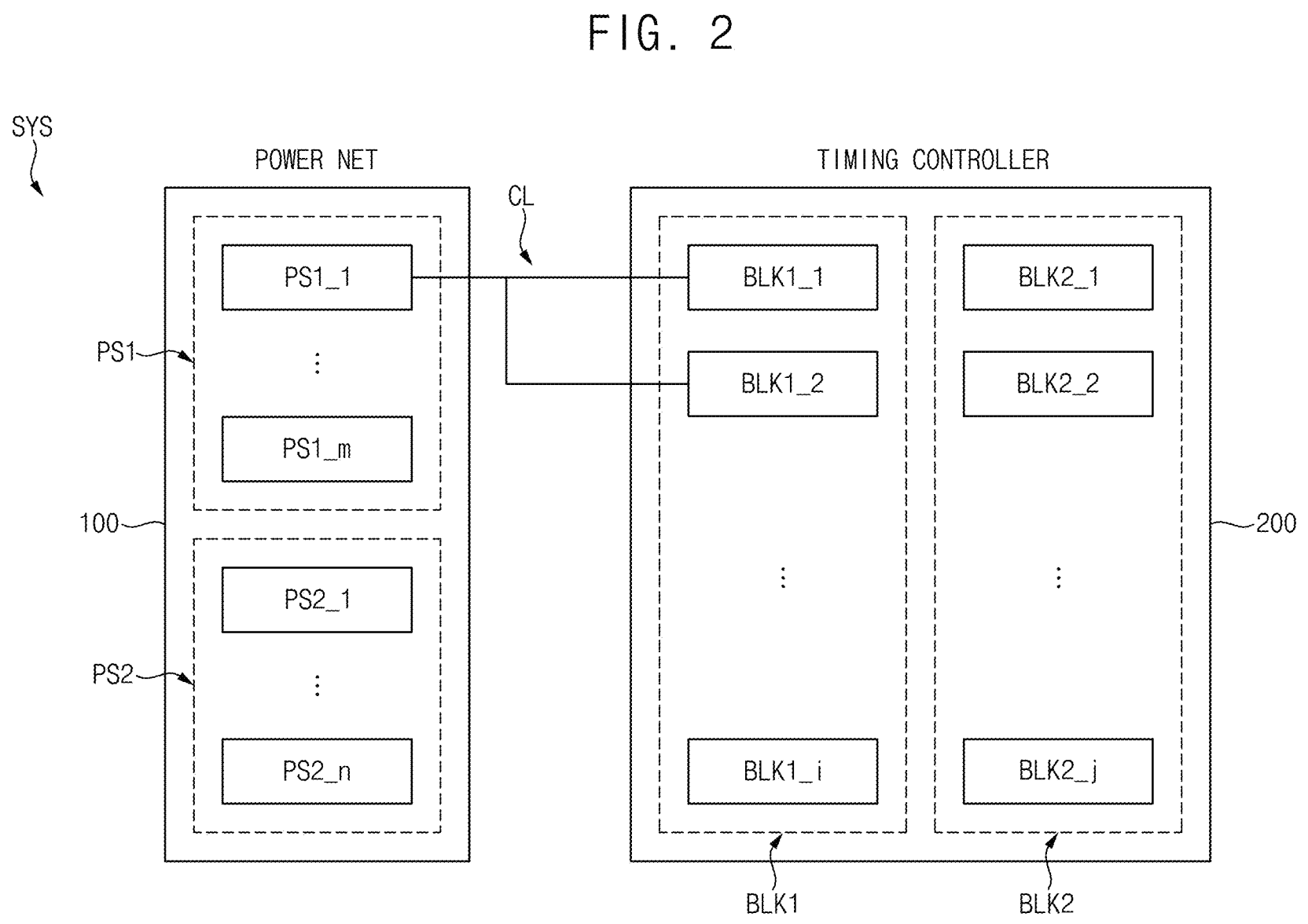
Figure 3:
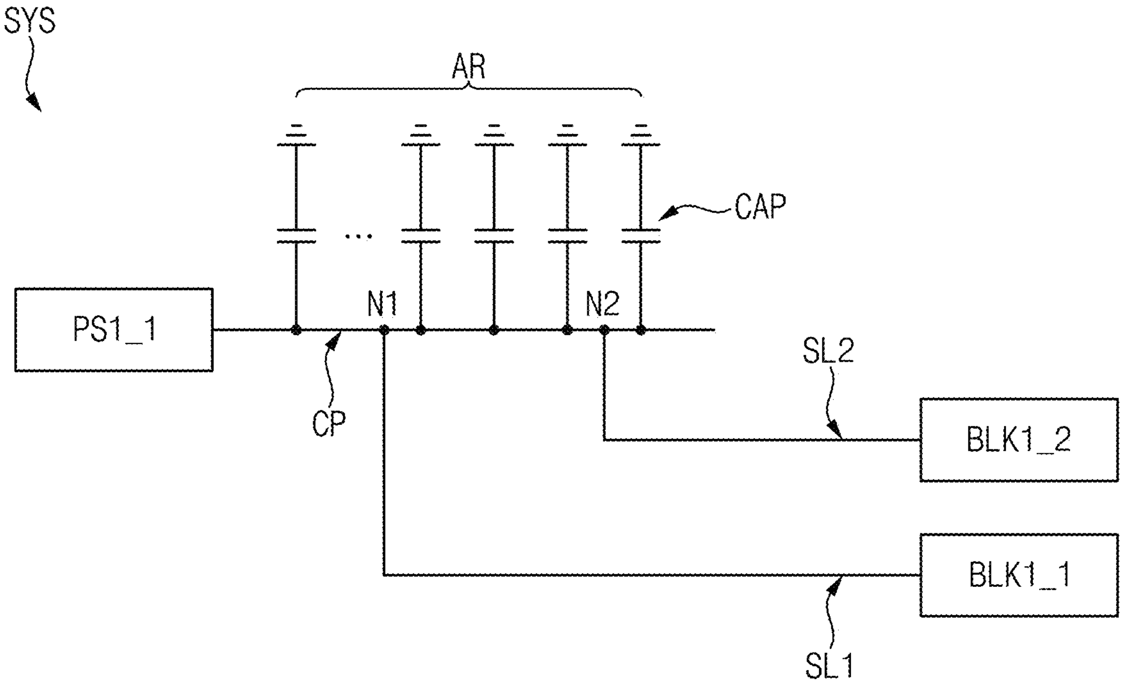

FIGS. 2 and 3 are diagrams illustrating a rated voltage transfer system SYS according to an embodiment of the present disclosure.

Referring to FIG. 2, the rated voltage transfer system SYS according to an embodiment of the present disclosure may be defined as a system for providing the power PV, refer to FIG. 1, to the timing controller 200. The rated voltage transfer system SYS may include the power net 100, the timing controller 200, and a rated voltage transfer line CL.

The power net 100 may include a plurality of power sources. Each of the plurality of power sources may generate a rated voltage. For example, the power net 100 may include a first power source portion PS1 and a second power source portion PS2.

The first power source portion PS1 may generate a first rated voltage. In an embodiment, the first power source portion PS1 may include first to m-th power sources PS1_1 to PS1_*m*. Here, m is a natural number greater than or equal to 2. Each of the first to m-th power sources PS1_1 to PS1_*m* may generate the first rated voltage.

The second power source portion PS2 may generate a second rated voltage that is different from the first rated voltage. For example, the first rated voltage may be a voltage of about 1.8 V, and the second rated voltage may be a voltage of about 1.05 V. In an embodiment, the second power source portion PS2 may include first to n-th power sources PS2_1 to PS2_*n*. Here, n is a natural number greater than or equal to 2. Each of the first to n-th power sources PS2_1 to PS2_*n* may generate the second rated voltage.

The timing controller 200 may include a plurality of blocks. Each of the plurality of blocks may be provided with a corresponding rated voltage to generate a driving control signal. For example, the timing controller 200 may include a first block portion BLK1 and a second block portion BLK2.

The first block portion BLK1 may generate a driving control signal by receiving the first rated voltage. In an embodiment, the first block portion BLK1 may include first to i-th blocks BLK1_1 to BLK1_*i*. Here, i is a natural number greater than or equal to 3. Each of the first to i-th blocks BLK1_1 to BLK1_*i* may receive the first rated voltage. Accordingly, the first to i-th blocks BLK1_1 to BLK1_*i* may generate different types of driving control signals.

The second block portion BLK2 may generate a driving control signal by receiving the second rated voltage. In an embodiment, the second block portion BLK2 may include first to j-th blocks BLK2_1 to BLK2_*j*. Here, j is a natural number greater than or equal to 3. Each of the first to j-th blocks BLK2_1 to BLK2_*j* may receive the second rated voltage. Accordingly, the first to j-th blocks BLK2_1 to BLK2_*j* may generate different types of driving control signals.

Each of the blocks BLK1_1 to BLK1_*i* and BLK2_1 to BLK2_*j* included in the first and second block portions BLK1 and BLK2 may generate different types of driving control signals. The sum of the number of the blocks BLK1_1 to BLK1_*i* included in the first block portion BLK1 and the number of the blocks BLK2_1 to BLK2_*j* included in the second block portion BLK2 may be equal to the number of a plurality of driving control signals generated by the timing controller 200.

In an embodiment, the blocks BLK1_1 to BLK1_*i* included in the first block portion BLK1 may receive the first rated voltage from the power sources PS1_1 to PS1_m included in the first power source portion PS1. In addition, the blocks BLK2_1 to BLK2_j included in the second block portion BLK2 may receive the second rated voltage from the power sources PS2_1 to PS2_n included in the second power source portion PS2.

In this case, a space in which the power net 100 may be arranged in the display device DD, refer to FIG. 1, may be limited. Accordingly, the number of the power sources PS1_1 to PS1_m included in the first power source portion PS1 may be smaller than the number of the blocks BLK1_1 to BLK1_i included in the first block portion BLK1.

To transfer the first rated voltage to each of the blocks BLK1_1 to BLK1_i included in the first block portion BLK1, at least one of the power sources among the power sources PS1_1 to PS1_m included in the first power source portion PS1 needs to be electrically connected to two or more blocks. For example, as illustrated in FIG. 2, the power source PS1_1 may be electrically connected to each of the two blocks BLK1_1 and BLK1_2 through the rated voltage transfer line CL.

Similarly, the number of the power sources PS2_1 to PS2_n included in the second power source portion PS2 may be smaller than the number of the blocks BLK2_1 to BLK2_j included in the second block portion BLK2. Accordingly, to transfer the second rated voltage to each of the blocks BLK2_1 to BLK2_j included in the second block portion BLK2, at least one power source among the power sources PS2_1 to PS2_n included in the second power source portion PS2 needs to be electrically connected to two or more blocks.

In FIG. 2, only the rated voltage transfer line CL electrically connecting the power source PS1_1 and the two blocks BLK1_1 and BLK1_2 is illustrated for convenience of description. In this case, the power sources PS1_1 to PS1_m included in the first power source portion PS1 may be electrically connected to the blocks BLK1_1 to BLK1_i included in the first block portion BLK1 by the rated voltage transfer line CL and other lines not illustrated. In addition, the power sources PS2_1 to PS2_n included in the second power source portion PS2 may be electrically connected to the blocks BLK2_1 to BLK2_j included in the second block portion BLK2.

Accordingly, each of the blocks BLK1_1 to BLK1_i included in the first block portion BLK1 may receive the first rated voltage, and each of the blocks BLK2_1 to BLK2_j included in the second block portion BLK2 may receive the second rated voltage.

Hereinafter, the rated voltage transfer system SYS of the present disclosure will be described based on the rated voltage transfer line CL, and the power source PS1_1 and the blocks BLK1_1 and BLK1_2 electrically connected through the rated voltage transfer line CL illustrated in FIG. 2. For example, the power source PS1_1 may be referred to as a first power source. The block BLK1_1 may be referred to as a first block, and the block BLK1_2 may be referred to as a second block.

Referring further to FIG. 3, the rated voltage transfer line CL may include a rated voltage applied portion CP, a capacitor CAP, a first sub-line SL1, and a second sub-line SL2.

The rated voltage applied portion CP may be electrically connected to the first power source PS1_1. Accordingly, the first rated voltage may be applied to the rated voltage applied portion CP.

A capacitor array AR may include at least one capacitor CAP. The capacitor CAP may include a first terminal and a second terminal. The first terminal of the capacitor CAP may be connected to the rated voltage applied portion CP, and the second terminal of the capacitor CAP may be grounded. In an embodiment, the capacitor CAP may be provided in plurality, and the plurality of capacitors CAP may be repeatedly arranged along a length direction of the rated voltage applied portion CP.

The capacitor CAP may serve to stabilize the supply of the first rated voltage. In an embodiment, the capacitor CAP may reduce a noise generated between a first contact portion CT1, refer to FIG. 5, and a second contact portion CT2, refer to FIG. 5. A detailed description thereof will be described below with reference to FIG. 5.

The first sub-line SL1 may be electrically connected to the rated voltage applied portion CP. In an embodiment, the first sub-line SL1 may be electrically connected to a first rated voltage transfer electrode CP_BR1, refer to FIG. 4, and the first rated voltage transfer electrode CP_BR1 may electrically contact the rated voltage applied portion CP at a first point N1. Accordingly, the first rated voltage applied to the rated voltage applied portion CP may be transferred to the first sub-line SL1.

The second sub-line SL2 may be electrically connected to the rated voltage applied portion CP. In an embodiment, the second sub-line SL2 may be electrically connected to a second rated voltage transfer electrode CP_BR2, refer to FIG. 4, and the second rated voltage transfer electrode CP_BR2 may electrically contact the rated voltage applied portion CP at a second point N2. In an embodiment, the first point N1 and the second point N2 may be spaced apart from each other by at least one capacitor CAP. That is, the first point N1 and the second point N2 may be spaced apart from each other by a third point of the rated voltage applied portion CP that electrically contacts at least one capacitor CAP. Accordingly, the first rated voltage applied to the rated voltage applied portion CP may be transferred to the second sub-line SL2.

The first sub-line SL1 may be electrically connected to the first block BLK1_1. Accordingly, the first block BLK1_1 may receive the first rated voltage. The second sub-line SL2 may be electrically connected to the second block BLK1_2. Accordingly, the second block BLK1_2 may receive the first rated voltage.

In this case, a first driving control signal generated in the first block BLK1_1 may be of a different type from a second driving control signal generated in the second block BLK1_2. For example, the first driving control signal may be the scan driving control signal SCS, refer to FIG. 1, and the second driving control signal may be the data driving control signal DCS, refer to FIG. 1. However, the present disclosure is not limited thereto.

When signal interference occurs between the first block BLK1_1 and the second block BLK1_2, a noise generated between the first block BLK1_1 and the second block BLK1_2 may be a problem. The noise may degrade the quality of the signal generated by each of the first block BLK1_1 and the second block BLK1_2, and thus, the display quality of the display device DD, refer to FIG. 1, may be degraded.

To reduce the noise generation, the rated voltage transfer line CL of the present disclosure may include the first sub-line SL1 and the second sub-line SL2 that are electrically connected to the rated voltage applied portion CP at different points. The first block BLK1_1 may be electrically connected to the first sub-line SL1, and the second block BLK1_2 may be electrically connected to the second sub-line SL2. That is, the first block BLK1_1 and the second block BLK1_2 may receive the first rated voltage by different lines.

Figure 4:
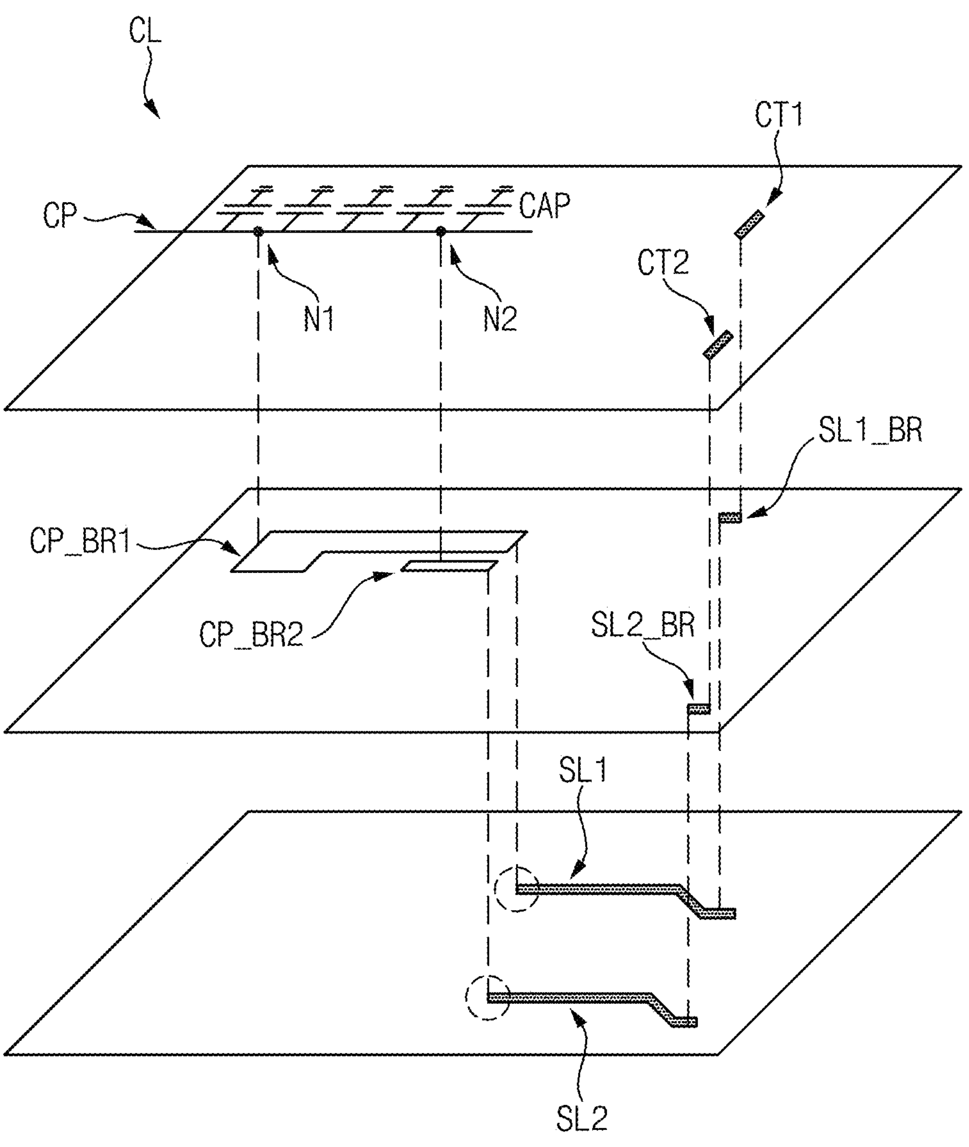
FIGS. 4 and 5 are views illustrating a rated voltage transfer line included in the rated voltage transfer system of FIG. 3.
Figure 5:
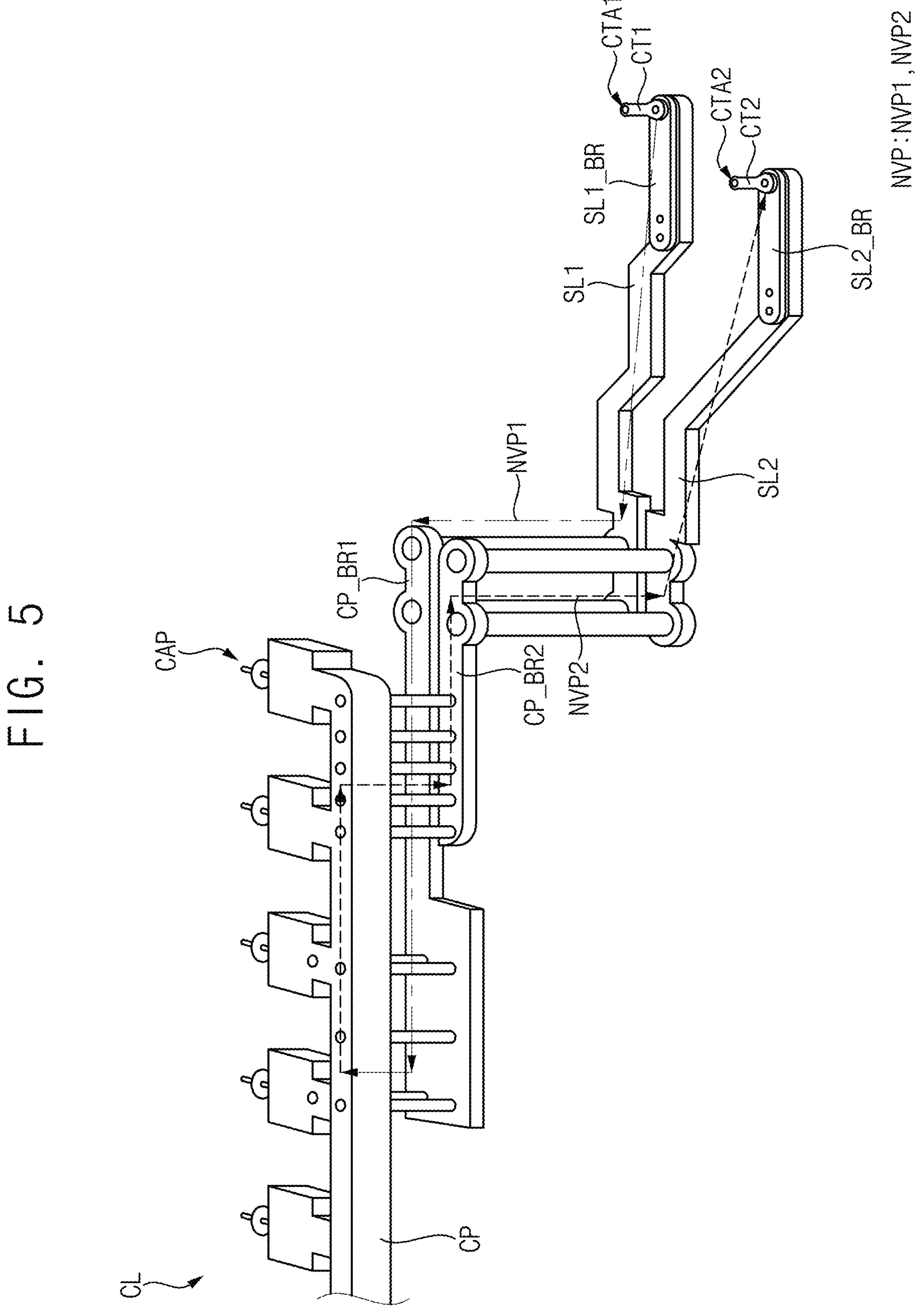

FIGS. 4 and 5 are views illustrating a rated voltage transfer line CL included in the rated voltage transfer system SYS of FIG. 3.

Referring to FIGS. 4 and 5, the rated voltage transfer line CL may include the rated voltage applied portion CP, the capacitor CAP, the first rated voltage transfer electrode CP_BR1, the second rated voltage transfer electrode CP_BR2, the first sub-line SL1, the second sub-line SL2, a first contact portion CT1, and a second contact portion CT2.

In an embodiment, the first sub-line SL1 and the second sub-line SL2 may be spaced apart from each other. That is, the first sub-line SL1 and the second sub-line SL2 may not be physically connected.

The first sub-line SL1 may be electrically connected to the rated voltage applied portion CP. In an embodiment, the first rated voltage transfer electrode CP_BR1 may be arranged between the first sub-line SL1 and the rated voltage applied portion CP, and the first rated voltage transfer electrode CP_BR1 may electrically contact the rated voltage applied portion CP at the first point N1. In addition, the first rated voltage transfer electrode CP_BR1 may electrically contact a first end of the first sub-line SL1. Accordingly, the first sub-line SL1 may be electrically connected to the rated voltage applied portion CP through the first rated voltage transfer electrode CP_BR1.

The second sub-line SL2 may be electrically connected to the rated voltage applied portion CP. In an embodiment, the second rated voltage transfer electrode CP_BR2 may be arranged between the second sub-line SL2 and the rated voltage applied portion CP, and the second rated voltage transfer electrode CP_BR2 may electrically contact the rated voltage applied portion CP at the second point N2. In addition, the second rated voltage transfer electrode CP_BR2 may electrically contact a first end of the second sub-line SL2. Accordingly, the second sub-line SL2 may be electrically connected to the rated voltage applied portion CP through the second rated voltage transfer electrode CP_BR2.

The first contact portion CT1 may be electrically connected to the first sub-line SL1. In an embodiment, at least one bridge electrode electrically connecting the first contact portion CT1 and the first sub-line SL1 may be arranged between the first contact portion CT1 and the first sub-line SL1. For example, a first bridge electrode SL1_BR may be arranged between the first contact portion CT1 and the first sub-line SL1. The first bridge electrode SL1_BR may electrically contact each of the first contact portion CT1 and the first sub-line SL1.

Accordingly, the first end of the first sub-line SL1 may electrically contact the first rated voltage transfer electrode CP_BR1, and a second end opposite to the first end of the first sub-line SL1 may electrically contact the first bridge electrode SL1_BR.

The second contact portion CT2 may electrically contact the second sub-line SL2. In an embodiment, at least one bridge electrode electrically connecting the second contact portion CT2 and the second sub-line SL2 may be arranged between the second contact portion CT2 and the second sub-line SL2. For example, a second bridge electrode SL2_BR may be arranged between the second contact portion CT2 and the second sub-line SL2. The second bridge electrode SL2_BR may electrically contact each of the second contact portion CT2 and the second sub-line SL2.

Accordingly, the first end of the second sub-line SL2 may electrically contact the second rated voltage transfer electrode CP_BR2, and a second end opposite to the first end of the second sub-line SL2 may electrically contact the second bridge electrode SL2_BR.

In an embodiment, the rated voltage applied portion CP, the first contact portion CT1, and the second contact portion CT2 may be arranged in the same layer as each other. In addition, the rated voltage applied portion CP, the first contact portion CT1, and the second contact portion CT2 may be spaced apart from each other.

In an embodiment, the first rated voltage transfer electrode CP_BR1, the second rated voltage transfer electrode CP_BR2, the first bridge electrode SL1_BR, and the second bridge electrode SL2_BR may be arranged in the same layer as each other. In addition, the first rated voltage transfer electrode CP_BR1, the second rated voltage transfer electrode CP_BR2, the first bridge electrode SL1_BR, and the second bridge electrode SL2_BR may be spaced apart from each other.

The first contact portion CT1 and the second contact portion CT2 may be electrically connected to the first block BLK1_1, refer to FIG. 3, and the second block BLK1_2, refer to FIG. 3, respectively. For example, as illustrated in FIG. 5, the first contact portion CT1 may include a first contact area CTA1 electrically contacting a power ball or the like included in the first block BLK1_1, and the second contact portion CT2 may include a second contact area CTA2 electrically contacting a power ball or the like included in the second block BLK1_2.

A first voltage transfer path, which is a path through which the first rated voltage output from the rated voltage applied portion CP is transferred to the first contact portion CT1, may be defined. As illustrated in FIG. 5, the first rated voltage output from the rated voltage applied portion CP may be transferred to the first contact portion CT1 through the first voltage transfer path that sequentially passes through the first rated voltage transfer electrode CP_BR1, the first sub-line SL1, and the first bridge electrode SL1_BR.

Similarly, a second voltage transfer path, which is a path through which the first rated voltage output from the rated voltage applied portion CP is transferred to the second contact portion CT2, may be defined. As illustrated in FIG. 5, the first rated voltage output from the rated voltage applied portion CP may be transferred to the second contact portion CT2 through the second voltage transfer path that sequentially passes through the second rated voltage transfer electrode CP_BR2, the second sub-line SL2, and the second bridge electrode SL2_BR.

A noise transfer path NVP through which a noise (e.g., a driving control signal generated in the first block BLK1_1) applied to the first contact portion CT1 is transferred to the second contact portion CT2 may be defined. The noise transfer path NVP may include a first noise transfer path NVP1 in which the noise applied to the first contact portion CT1 is transferred to the rated voltage applied portion CP, and a second noise transfer path NVP2 in which the noise is transferred from the rated voltage applied portion CP to the second contact portion CT2.

As illustrated in FIG. 5, the noise applied to the first contact portion CT1 may be transferred to the rated voltage applied portion CP through the first noise transfer path NVP1 that sequentially passes through the first bridge electrode SL1_BR, the first sub-line SL1, and the first rated voltage transfer electrode CP_BR1. In addition, the noise transferred to the rated voltage applied portion CP may be transferred to the second contact portion CT2 through the second noise transfer path NVP2 that sequentially passes through the second rated voltage transfer electrode CP_BR2, the second sub-line SL2, and the second bridge electrode SL2_BR.

When a length of the noise transfer path NVP is relatively small, a noise may occur between a driving control signal generated by the first block BLK1_1 electrically connected to the first contact CT1, and a driving control signal generated by the second block BLK1_2 electrically connected to the second contact CT2.

In an embodiment, each of a length of the first voltage transfer path and a length of the second voltage transfer path may be smaller than a length of the noise transfer path NVP. That is, the length of the noise transfer path NVP may be relatively large. Accordingly, the first contact portion CT1 may normally receive the first rated voltage through the first voltage transfer path, and the second contact portion CT2 may normally receive the first rated voltage through the second voltage transfer path. In addition, since the length of the noise transfer path NVP is relatively large, the noise generated between the first contact portion CT1 and the second contact portion CT2 may be reduced.

In an embodiment, the noise applied to the first contact portion CT1 may be transferred to the second contact portion CT2 passing through at least one capacitor CAP connected to the rated voltage applied portion CP. That is, the noise applied to the first contact portion CT1 may be transferred to the second contact portion CT2 passing through the third point of the rated voltage applied portion CP that electrically contacts at least one capacitor CAP. In other words, the noise transfer path NVP may include a path passing through the third point of the rated voltage applied portion CP that electrically contacts at least one capacitor CAP. For example, in the second noise transfer path NVP2 in which the noise is transferred from the rated voltage applied portion CP to the second contact portion CT2, the noise may be transferred to the second rated voltage transfer electrode CP_BR2 passing through at least one capacitor CAP connected to the rated voltage applied portion CP. In other words, in the second noise transfer path NVP2, the noise may be transferred to the second rated voltage transfer electrode CP_BR2 passing through the third point of the rated voltage applied portion CP that electrically contacts at least one capacitor CAP. As the noise applied to the first contact portion CT1 is transferred to the second contact portion CT2 passing through at least one capacitor CAP, the noise generated between the first contact portion CT1 and the second contact portion CT2 may be effectively reduced. That is, at least one capacitor CAP may dampen the noise.

Figure 6:
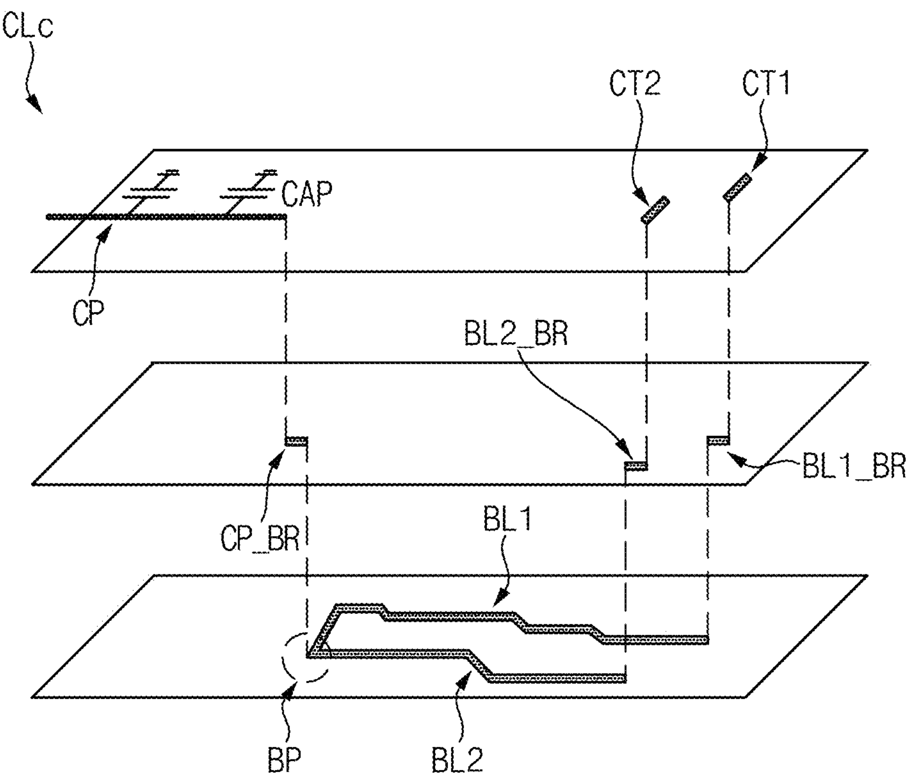
FIGS. 6 and 7 are views illustrating a rated voltage transfer line according to a comparative example.
Figure 7:
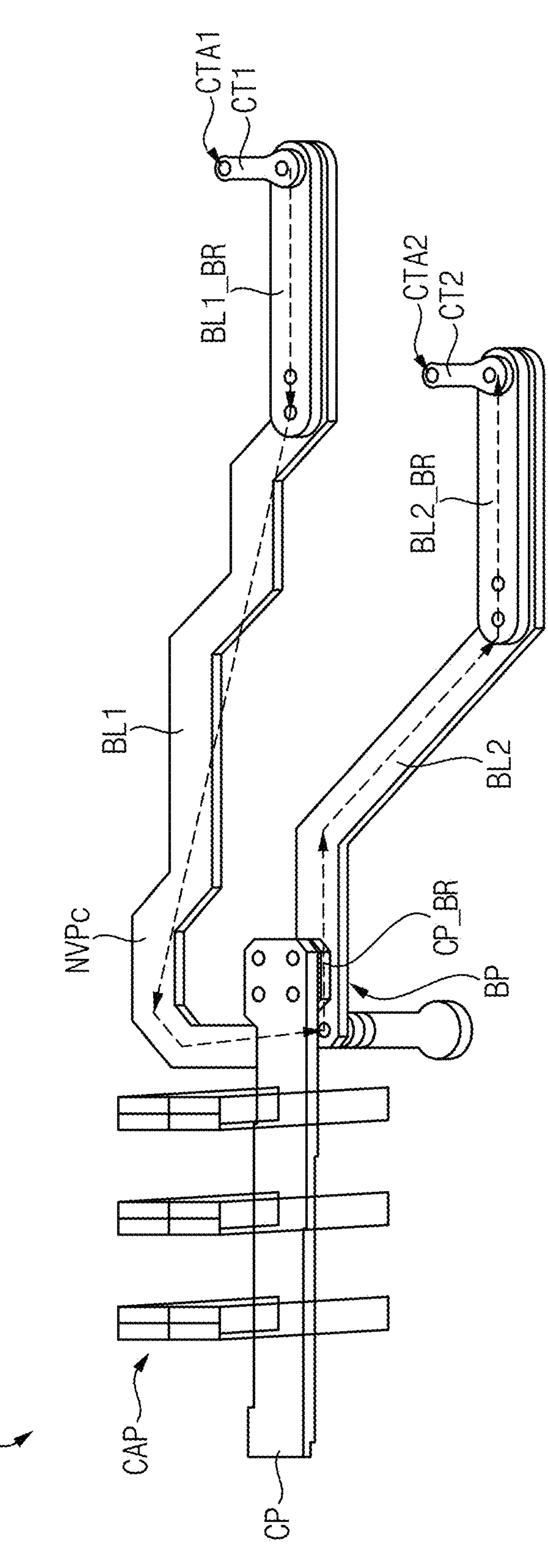

FIGS. 6 and 7 are views illustrating a rated voltage transfer line CLc according to a comparative example.

Referring to FIGS. 6 and 7, the rated voltage transfer line CLc may include a rated voltage applied portion CP, a capacitor CAP, a rated voltage transfer electrode CP_BR, a first branch line BL1, a second branch line BL2, a first bridge electrode BL1_BR, a second bridge electrode BL2_BR, a first contact portion CT1, and a second contact portion CT2. Hereinafter, redundant descriptions of the rated voltage transfer line CL described above with reference to FIGS. 4 and 5 may be omitted or may be summarized.

The first branch line BL1 and the second branch line BL2 may be integrally formed. That is, the first branch line BL1 and the second branch line BL2 may branch and extend from a branch portion BP.

The branch portion BP may be electrically connected to the rated voltage applied portion CP. For example, the rated voltage transfer electrode CP_BR may be arranged between the branch portion BP and the rated voltage applied portion CP, and the rated voltage transfer electrode CP_BR may electrically contact each of the branch portion BP and the rated voltage applied portion CP. Accordingly, the branch portion BP may be electrically connected to the rated voltage applied portion CP through the rated voltage transfer electrode CP_BR.

The first contact portion CT1 may be electrically connected to the first branch line BL1. For example, the first bridge electrode BL1_BR may be arranged between the first contact portion CT1 and the first branch line BL1, and the first bridge electrode BL1_BR may electrically contact each of the first contact portion CT1 and the first branch line BL1.

The second contact portion CT2 may be electrically connected to the second branch line BL2. For example, the second bridge electrode BL2_BR may be arranged between the second contact portion CT2 and the second branch line BL2, and the second bridge electrode BL2_BR may electrically contact each of the second contact portion CT2 and the second branch line BL2.

The first contact portion CT1 and the second contact portion CT2 may be electrically connected to the first block BLK1_1, refer to FIG. 3, and the second block BLK1_2, refer to FIG. 3, respectively.

A first voltage transfer path, which is a path through which a first rated voltage output from the rated voltage applied portion CP is transferred to the first contact portion CT1, may be defined. As illustrated in FIG. 7, the first rated voltage output from the rated voltage applied portion CP may be transferred to the first contact portion CT1 through a path that sequentially passes through the rated voltage transfer electrode CP_BR, the branch portion BP, the first branch line BL1, and the first bridge electrode BL1_BR.

Similarly, a second voltage transfer path, which is a path through which the first rated voltage output from the rated voltage applied portion CP is transferred to the second contact portion CT2, may be defined. As illustrated in FIG. 7, the first rated voltage output from the rated voltage applied portion CP may be transferred to the second contact portion CT2 through a path that sequentially passes through the rated voltage transfer electrode CP_BR, the branch portion BP, the second branch line BL2, and the second bridge electrode BL2_BR.

In addition, a noise transfer path NVPc through which a noise applied to the first contact portion CT1 is transferred to the second contact portion CT2 may be defined. As illustrated in FIG. 7, the noise applied to the first contact portion CT1 may be transferred to the second contact portion CT2 through the noise transfer path NVPc that sequentially passes through the first bridge electrode BL1_BR, the first branch line BL1, the branch portion BP, the second branch line BL2, and the second bridge electrode BL2_BR.

Compared to the rated voltage transfer line CL described above with reference to FIG. 5, in the rated voltage transfer line CLc according to a comparative example, the noise applied to the first contact portion CT1 may be transferred to the second contact portion CT2 without passing through the capacitor CAP, or passing through a relatively small number of capacitors CAP. In other words, compared to the noise transfer path NVP described above with reference to FIG. 5, the noise transfer path NVPc according to a comparative example may not pass through a point of the rated voltage applied portion CP that electrically contacts the capacitor CAP or may pass through a point of the rated voltage applied portion CP that electrically contacts a relatively small number of capacitors CAP. Accordingly, compared to the rated voltage transfer line CL described above with reference to FIG. 5, in the rated voltage transfer line CLc according to a comparative example, the noise generated between the first contact portion CT1 and the second surface CT2 may be relatively large.

Figure 8:
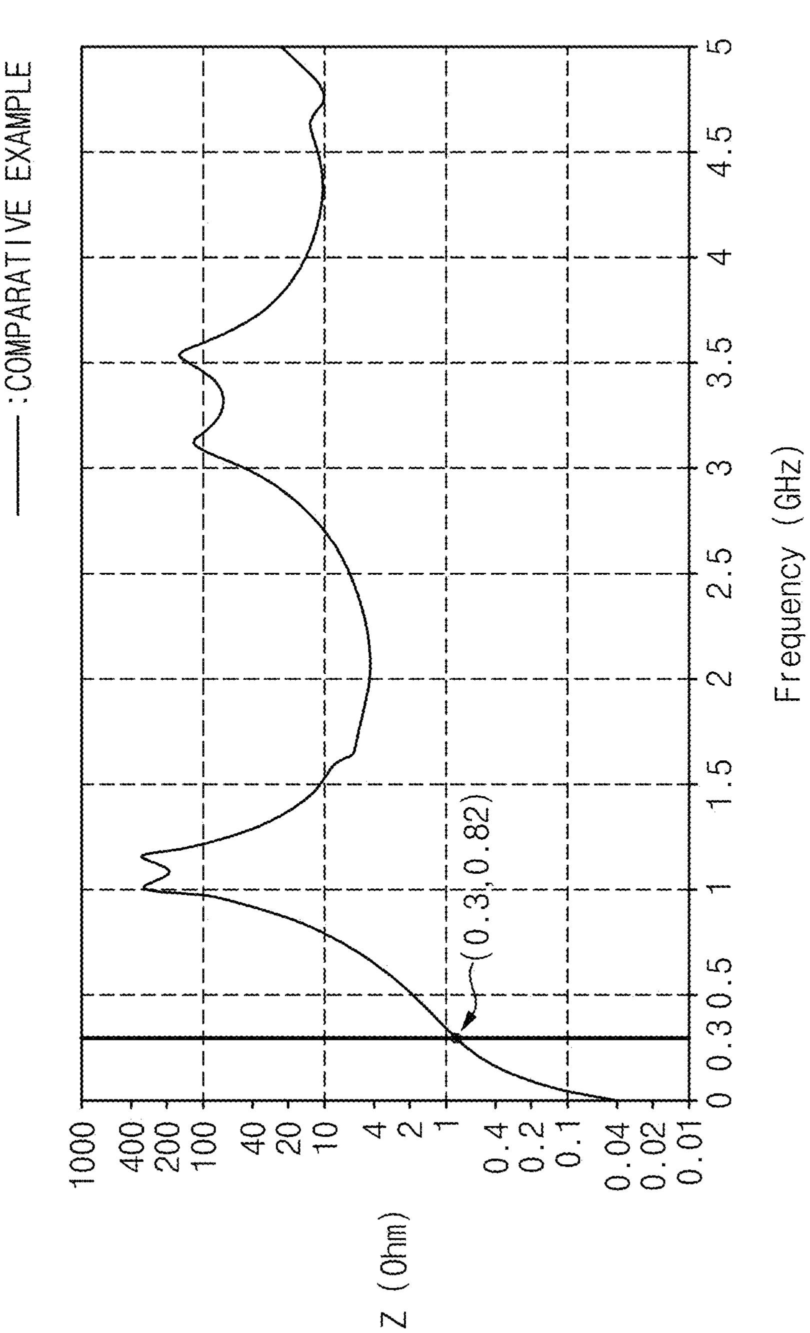
FIG. 8 is a graph illustrating a noise generated between a first contact portion and a second contact portion in the rated voltage transfer line of FIG. 7.
Figure 9:
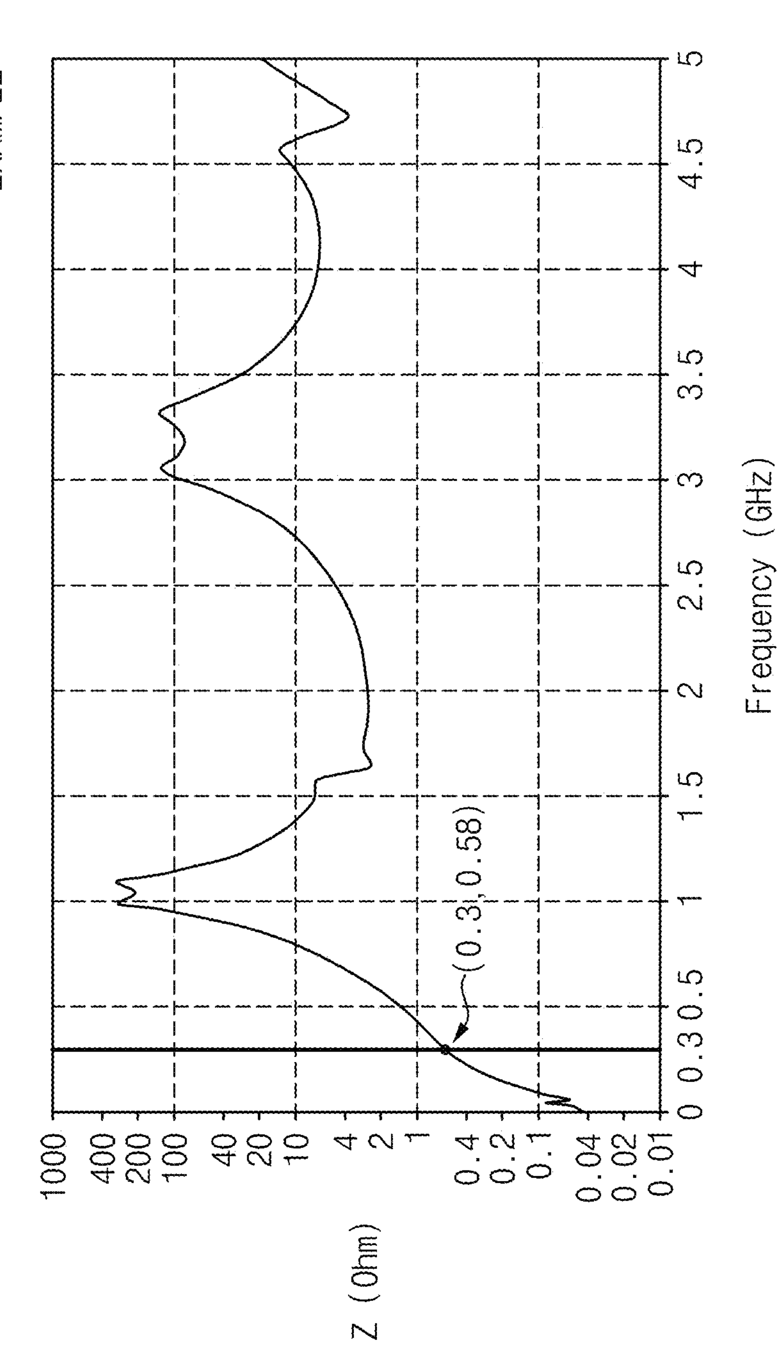
FIG. 9 is a graph illustrating a noise generated between a first contact portion and a second contact portion in the rated voltage transfer line of FIG. 5.

FIG. 8 is a graph illustrating a noise generated between a first contact portion and a second contact portion in the rated voltage transfer line of FIG. 7. For example, FIG. 8 is a graph illustrating the noise generated between the first contact portion CT1 and the second contact portion CT2 in the rate voltage transfer line CLc according to a comparative example. FIG. 9 is a graph illustrating a noise generated between a first contact portion and a second contact portion in the rated voltage transfer line of FIG. 5. For example, FIG. 9 is a graph illustrating the noise generated between the first contact portion CT1 and the second contact portion CT2 in the rated voltage transfer line CL according to an embodiment of the present disclosure. Hereinafter, the effects of the present disclosure will be described below with reference to FIGS. 5, 7, 8, and 9.

The noise illustrated in FIGS. 8 and 9 may be represented by a transfer impedance Z. The Y-axis of each of the graphs illustrated in FIGS. 8 and 9 represents the transfer impedance, and the X-axis of each of the graphs illustrated in FIGS. 8 and 9 represents a frequency range.

Referring to FIGS. 8 and 9, when a first voltage is applied and a first current flows through the first contact portion CT1, a noise voltage may be applied to the second contact portion CT2 through a noise transfer path. For example, a second voltage may be applied and a second current may flow through the second contact portion CT2.

A value obtained by dividing the second voltage by the second current may be defined as the transfer impedance Z of the second contact portion CT2 by the first contact portion CT1. It can be interpreted that the lower the transfer impedance Z, the smaller the noise generated between the first contact portion CT1 and the second contact portion CT2.

As illustrated in FIG. 8, in the case of the rated voltage transfer line CLc according to the comparative example, in a frequency range of about 0 to about 0.3 GHZ, the transfer impedance (Z) was measured to have a value of about 0.82 Ohm or less. In addition, as illustrated in FIG. 9, in the case of the rated voltage transfer line CL according to an embodiment (or, example) of the present disclosure, in a frequency range of about 0 to about 0.3 GHZ, the transfer impedance Z was measured to have a value of about 0.58 Ohm or less. From these results, it can be seen that the noise generated between the first contact portion CT1 and the second contact portion CT2 in the rated voltage transfer line CL according to an embodiment of the present disclosure is relatively smaller than the noise generated in the rated voltage transfer line CLc according to the comparative example.

Figure 10:
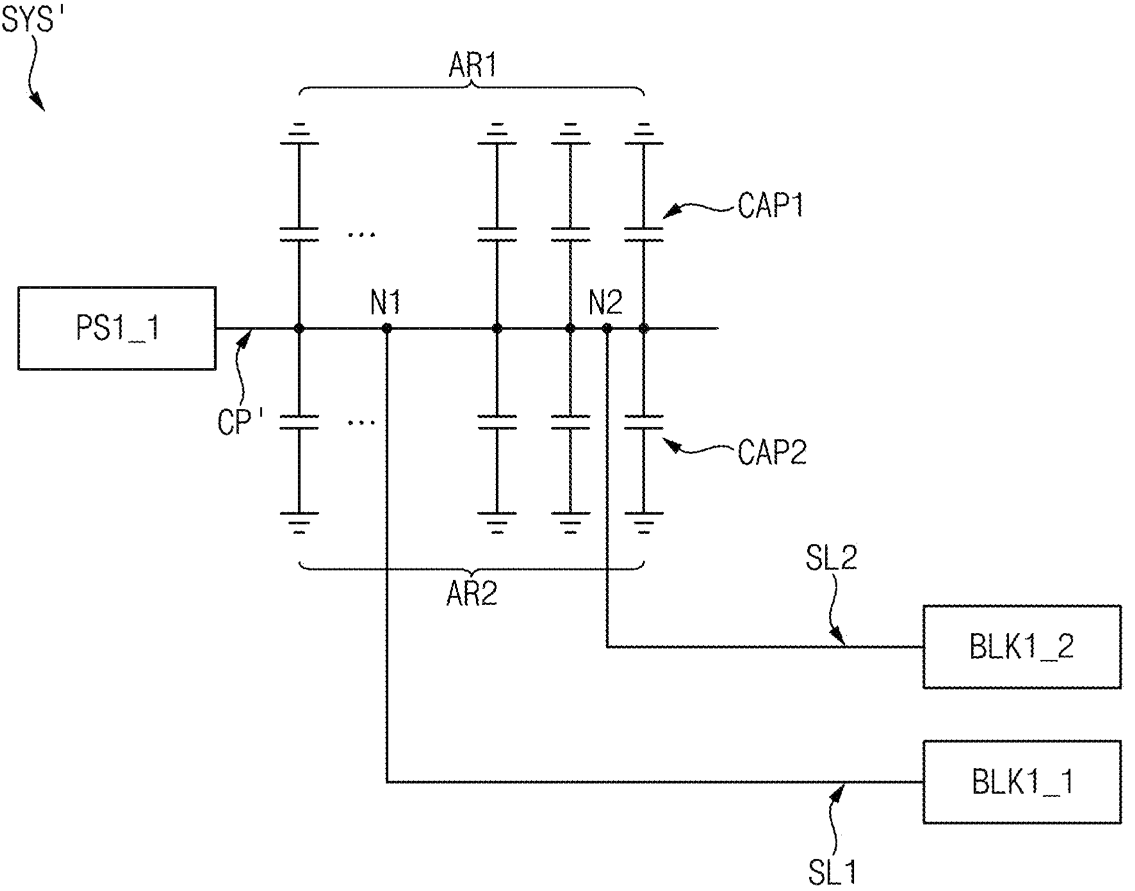
FIG. 10 is a diagram illustrating a rated voltage transfer system according to an embodiment of the present disclosure.
Figure 11:
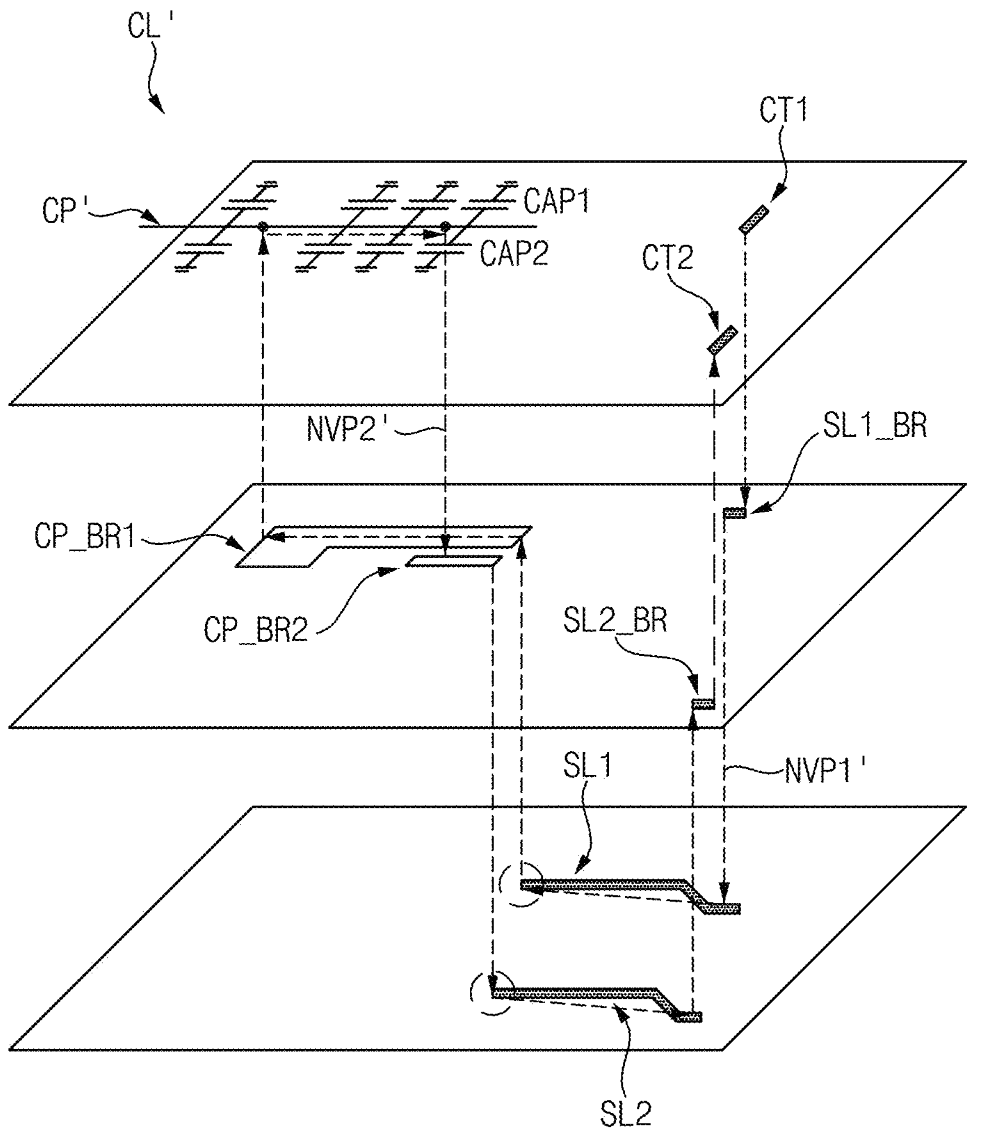
FIG. 11 is a view illustrating a rated voltage transfer line included in the rated voltage transfer system of FIG. 10.

FIG. 10 is a diagram illustrating a rated voltage transfer system SYS' according to an embodiment of the present disclosure. FIG. 11 is a view illustrating a rated voltage transfer line CL' included in the rated voltage transfer system SYS' of FIG. 10.

Referring to FIGS. 10 and 11, the rated voltage transfer system SYS' according to an embodiment of the present disclosure may include a power net 100, refer to FIG. 2, a timing controller 200, refer to FIG. 2, and the rated voltage transfer line CL'. The rated voltage transfer line CL' may include a rated voltage applied portion CP', a first capacitor CAP1, a second capacitor CAP2, a first rated voltage transfer electrode CP_BR1, and a second rated voltage transfer electrode CP_BR2, a first sub-line SL1, a second sub-line SL2, a first bridge electrode SL1_BR, a second bridge electrode SL2_BR, a first contact portion CT1, and a second contact portion CT2.

The rated voltage transfer line CL' may be substantially the same as the rated voltage transfer line CL described above with reference to FIGS. 3 to 5, except that the first capacitor CAP1 is arranged on a first side of the rated voltage applied portion CP', and the second capacitor CAP2 is arranged on a second side opposite the first side of the rated voltage applied portion CP'. Hereinafter, redundant descriptions of the rated voltage transfer line CL described above with reference to FIGS. 3 to 5 may be omitted or may be summarized.

The rated voltage applied portion CP' may be electrically connected to the first power source PS1_1. Accordingly, the first rated voltage may be applied to the rated voltage applied portion CP'.

A first capacitor array AR1 may include at least one first capacitor CAP1. In an embodiment, the first capacitor array AR1 may be arranged on the first side of the rated voltage applied portion CP'. In other words, at least one first capacitor CAP1 may be arranged on the first side of the rated voltage applied portion CP'. The first capacitor CAP1 may include a first terminal and a second terminal. The first terminal of the first capacitor CAP1 may be connected to the rated voltage applied portion CP', and the second terminal of the first capacitor CAP1 may be grounded. In an embodiment, the first capacitor CAP1 may be provided in plurality, and the plurality of first capacitors CAP1 may be repeatedly arranged along a length direction of the rated voltage applied portion CP'.

A second capacitor array AR2 may include at least one second capacitor CAP2. In an embodiment, the second capacitor array AR2 may be arranged on the second side opposite to the first side of the rated voltage applied portion CP'. In other words, at least one second capacitor CAP2 may be arranged on the second side of the rated voltage applied portion CP'. The second capacitor CAP2 may include a first terminal and a second terminal. The first terminal of the second capacitor CAP2 may be connected to the rated voltage applied portion CP', and the second terminal of the second capacitor CAP2 may be grounded. In an embodiment, the second capacitor CAP2 may be provided in plurality, and the plurality of second capacitors CAP2 may be repeatedly arranged along the length direction of the rated voltage applied portion CP'.

The first capacitor CAP1 and the second capacitor CAP2 may serve to stabilize the supply of the first rated voltage. In an embodiment, the first capacitor CAP1 and the second capacitor CAP2 may reduce a noise generated between the first contact portion CT1 and the second contact portion CT2.

The first sub-line SL1 may be electrically connected to the rated voltage applied portion CP'. In an embodiment, the first sub-line SL1 may be electrically connected to the first rated voltage transfer electrode CP_BR1, and the first rated voltage transfer electrode CP_BR1 may electrically contact the rated voltage applied portion CP' at a first point N1.

The second sub-line SL2 may be electrically connected to the rated voltage applied portion CP'. In an embodiment, the second sub-line SL2 may be electrically connected to the second rated voltage transfer electrode CP_BR2, and the second rated voltage transfer electrode CP_BR2 may electrically contact the rated voltage applied portion CP' at a second point N2. In an embodiment, the first point N1 and the second point N2 may be spaced apart from each other by at least one first capacitor CAP1 and at least one second capacitor CAP2. That is, the first point N1 and the second point N2 may be spaced apart from each other by a third point of the rated voltage applied portion CP' that electrically contacts at least one first capacitor CAP1 and a fourth point of the rated voltage applied portion CP' that electrically contacts at least one second capacitor CAP2.

The first contact portion CT1 may be electrically connected to the first sub-line SL1. In an embodiment, at least one first bridge electrode SL1_BR electrically connecting the first contact portion CT1 and the first sub-line SL1 may be arranged between the first contact portion CT1 and the first sub-line SL1.

The second contact portion CT2 may be electrically connected to the second sub-line SL2. In an embodiment, at least one second bridge electrode SL2_BR electrically connecting the second contact portion CT2 and the second sub-line SL2 may be arranged between the second contact portion CT2 and the second sub-line SL2.

The first contact portion CT1 and the second contact portion CT2 may be electrically connected to the first block BLK1_1 and the second block BLK1_2, respectively. For example, the first contact portion CT1 may include a first contact area CTA1 electrically contacting a power ball or the like included in the first block BLK1_1, and the second contact portion CT2 may include a second contact area CTA2 electrically contacting a power ball or the like included in the second block BLK1_2.

A noise transfer path NVP' through which a noise applied to the first contact portion CT1 (for example, a driving control signal generated in the first block BLK1_1) is transferred to the second contact portion CT2 may be defined. The noise transfer path NVP' may include a first noise transfer path NVP1' in which the noise applied to the first contact portion CT1 is transferred to the rated voltage applied portion CP', and a second noise transfer path NVP2' in which the noise is transferred from the rated voltage applied portion CP' to the second contact portion CT2.

As illustrated in FIG. 11, the noise applied to the first contact portion CT1 may be transferred to the rated voltage applied portion CP' through the first noise transfer path NVP1' that sequentially passes through the first bridge electrode SL1_BR, the first sub-line SL1, and the first rated voltage transfer electrode CP_BR1. In addition, the noise transferred to the rated voltage applied portion CP' may be transferred to the second contact portion CT2 through the second noise transfer path NVP2' that sequentially passes through the second rated voltage transfer electrode CP_BR2, the second sub-line SL2, and the second bridge electrode SL2_BR.

In an embodiment, the noise applied to the first contact portion CT1 may be transferred to the second contact portion CT2 through at least one first capacitor CAP1 and at least one second capacitor CAP2 connected to the rated voltage applied portion CP'. That is, the noise applied to the first contact portion CT1 may be transferred to the second contact portion CT2 through the third point of the rated voltage applied portion CP' that electrically contacts at least one first capacitor CAP1 and the fourth point of the rated voltage applied portion CP' that electrically contacts at least one second capacitor CAP2. In other words, the noise transfer path NVP' may include a path passing through the third point of the rated voltage applied portion CP' that electrically contacts at least one first capacitor CAP1 and the fourth point of the rated voltage applied portion CP' that electrically contacts at least one second capacitor CAP2. For example, in the second noise transfer path NVP2' in which the noise is transferred from the rated voltage applied portion CP' to the second contact portion CT2, the noise may be transferred to the second rated voltage transfer electrode CP_BR2 passing through at least one first capacitor CAP1 and the at least one second capacitor CAP2 connected to the rated voltage applied portion CP'. In other words, in the second noise transfer path NVP2', the noise may be transferred to the second rated voltage transfer electrode CP_BR2 passing through the third point of the rated voltage applied portion CP' that electrically contacts at least one first capacitor CAP1 and the fourth point of the rated voltage applied portion CP' that electrically contacts at least one second capacitor CAP2. As the noise applied to the first contact portion CT1 is transferred to the second contact portion CT2 passing through at least one first capacitor CAP1 and at least one second capacitor CAP2, the noise generated between the first contact portion CT1 and the second contact portion CT2 may be effectively reduced. That is, at least one first capacitor CAP1 and at least one second capacitor CAP2 may dampen the noise.

Figure 12:
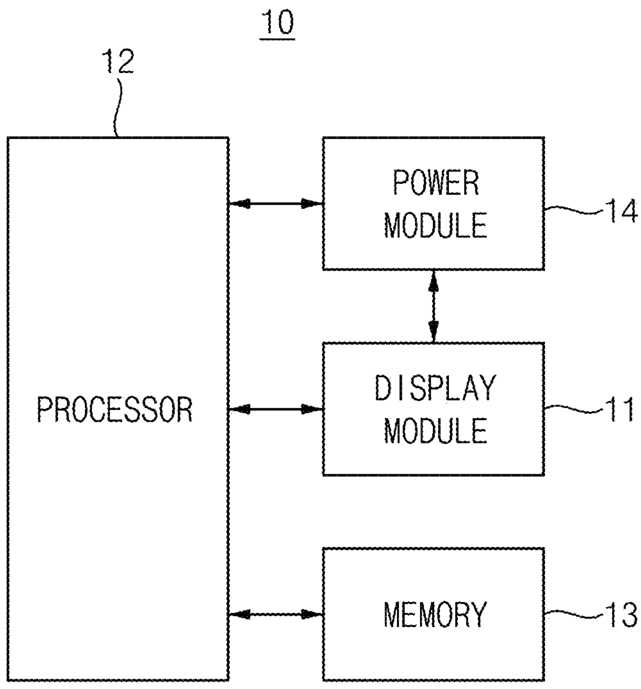
FIG. 12 is a block diagram of an electronic device according to an embodiment of the present disclosure.

FIG. 12 is a block diagram of an electronic device 10 according to an embodiment of the present disclosure.

Referring to FIG. 12, the electronic device 10 according to an embodiment may include a display module 11, a processor 12, a memory 13, and a power module 14. The display device according to an embodiment may be applied to a variety of electronic devices. The electronic device 10 according to an embodiment may include the display device described above, and may further include modules or devices having other additional functions in addition to the display device.

The processor 12 may include at least one of a central processing unit (CPU), an application processor (AP), a graphic processing unit (GPU), a communication processor (CP), an image signal processor (ISP), and a controller.

The memory 13 may store data information required for operation of the processor 12 or the display module 11. When the processor 12 executes an application stored in the memory 13, an image data signal and/or a input control signal may be transferred to the display module 11, and the display module 11 may process the received signals and may output image information through a display screen. For example, the processor 12 may transfer the image data signal and/or the input control signal to the timing controller 200 of FIG. 1.

The power module 14 may include a power supply module, such as a power adapter or a battery device, etc., and a power conversion module that converts power supplied by the power supply module to generate the power required for operation of the electronic device 10. For example, the power module 14 may correspond to the power net 100 of FIG. 1. In an embodiment, the electronic device 10 may further include the above-described rated voltage transfer line CL, refer to FIG. 2, that transfer the voltage provided by the power module 14 to the display module 11, specifically, the timing controller 200 of FIG. 1.

At least one of the components of the electronic device 10 described above may be included in the display device according to the embodiments described above. In addition, some of the individual modules that are functionally included in one module may be included in the display device and others may be provided separately from the display device. For example, the display device may include the display module 11, and the processor 12, the memory 13, and the power module 14 may be provided in the form of other devices in the electronic device 10 other than the display device.

Figure 13:
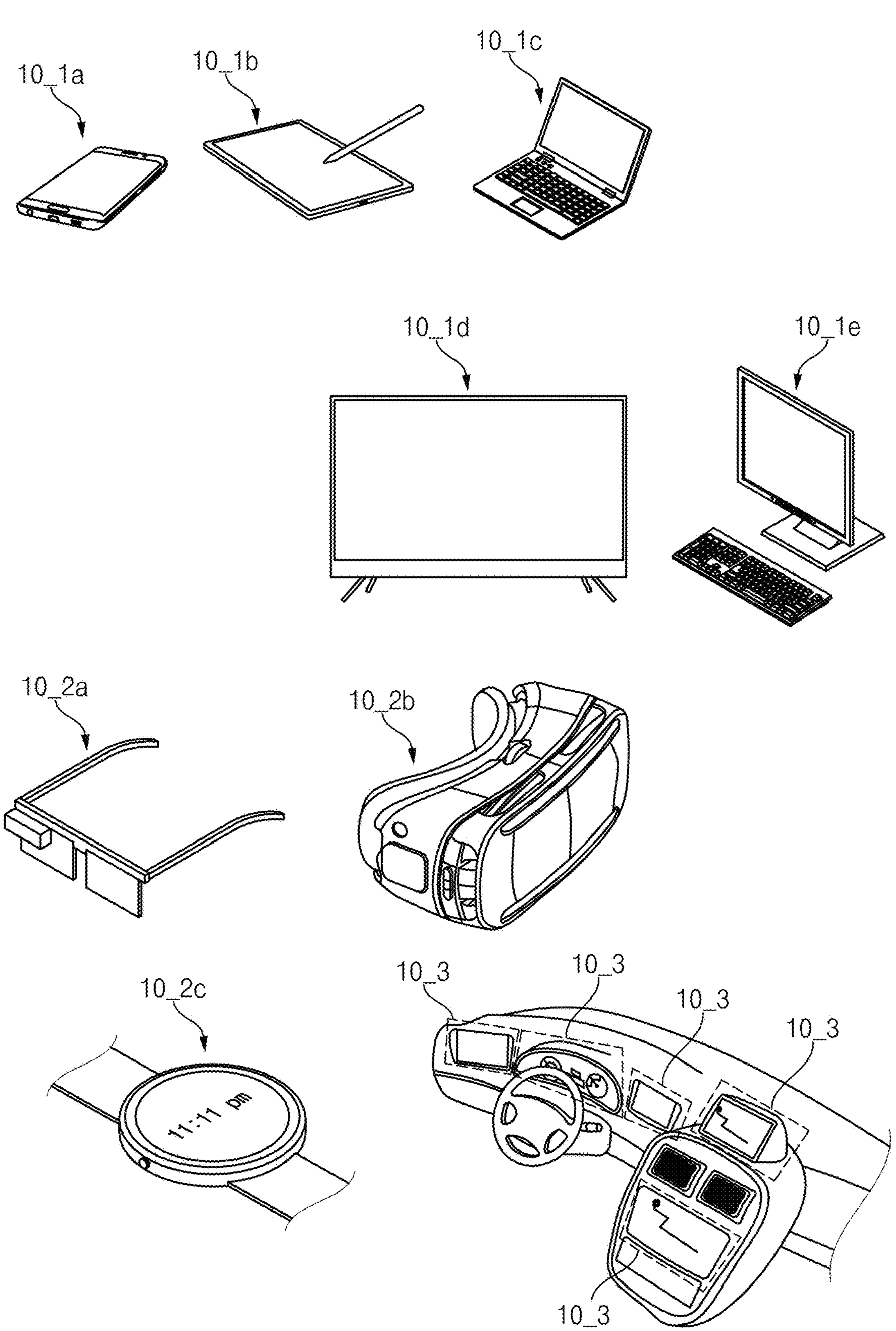
FIG. 13 is a schematic diagram of an electronic device according to various embodiments.

FIG. 13 is a schematic diagram of an electronic device according to various embodiments.

Referring to FIG. 13, various electronic devices to which a display device according to the embodiments is applied may include image display electronic devices such as a smartphones 10_1*a*, a tablet PC 10_1*b*, a laptop 10_1*c*, a television 10_1*d*, a desk monitor 10_1*e*, etc., wearable electronic devices including display modules such as a smart glasses 10_2*a*, a head-mounted display 10_2*b*, and a smart watch 10_2*c*, etc., and vehicle electronic devices 10_3 including display modules such as a CID (center information display) which may be disposed on a instrument panel, a center fascia, and a dashboard of an automobile and a room mirror display, etc.

The present disclosure may be applied to various display devices. For example, the present disclosure is applicable to various display devices such as display devices for vehicles, ships and aircraft, portable communication devices, display devices for exhibition or information transmission, medical display devices, and the like.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined in the appended claims.

What is claimed is:

1. A rated voltage transfer line comprising:

a rated voltage applied portion to which a first rated voltage is applied;

at least one capacitor comprising a first terminal connected to the rated voltage applied portion and a second terminal grounded;

a first rated voltage transfer electrode which electrically contacts the rated voltage applied portion at a first point;

a second rated voltage transfer electrode which electrically contacts the rated voltage applied portion at a second point different from the first point;

a first sub-line electrically connected to the first rated voltage transfer electrode; and a second sub-line electrically connected to the second rated voltage transfer electrode.

2. The rated voltage transfer line of claim 1, wherein the first point and the second point are spaced apart from each other by the at least one capacitor.

3. The rated voltage transfer line of claim 1, wherein the first sub-line and the second sub-line are spaced apart from each other.

4. The rated voltage transfer line of claim 1, further comprising:

a first contact portion electrically connected to the first sub-line; and a second contact portion electrically connected to the second sub-line.

5. The rated voltage transfer line of claim 4, wherein a noise transfer path through which a noise applied to the first contact portion is transferred to the second contact portion is defined, and wherein the noise transfer path comprises a path passing through a third point of the rated voltage applied portion which electrically contacts the at least one capacitor.

6. The rated voltage transfer line of claim 5, wherein the noise transfer path comprises:

a first noise transfer path in which the noise applied to the first contact portion is transferred to the rated voltage applied portion; and a second noise transfer path in which the noise is transferred from the rated voltage applied portion to the second contact portion.

7. The rated voltage transfer line of claim 6, wherein the noise is transferred to the second contact portion passing through the third point which electrically contacts the at least one capacitor in the second noise transfer path.

8. The rated voltage transfer line of claim 5, wherein a first voltage transfer path is defined as a path through which the first rated voltage output from the rated voltage applied portion is transferred to the first contact portion, wherein a second voltage transfer path is defined as a path through which the first rated voltage output from the rated voltage applied portion is transferred to the second contact portion, and wherein each of a length of the first voltage transfer path and a length of the second voltage transfer path is smaller than a length of the noise transfer path.

9. The rated voltage transfer line of claim 4, further comprising:

a first bridge electrode which is arranged between the first contact portion and the first sub-line and electrically connects the first contact portion and the first sub-line; and a second bridge electrode which is arranged between the second contact portion and the second sub-line and electrically connects the second contact portion and the second sub-line.

10. The rated voltage transfer line of claim 1, further comprising:

a plurality of capacitors including the at least one capacitor, and wherein the plurality of capacitors is repeatedly arranged along a length direction of the rated voltage applied portion.

11. The rated voltage transfer line of claim 1, wherein the at least one capacitor comprises:

at least one first capacitor arranged on a first side of the rated voltage applied portion; and at least one second capacitor arranged on a second side opposite to the first side of the rated voltage applied portion.

12. The rated voltage transfer line of claim 11, wherein the first point and the second point are spaced apart from each other by the at least one first capacitor and the at least one second capacitor.

13. The rated voltage transfer line of claim 11, further comprising:

a first contact portion electrically connected to the first sub-line; and a second contact portion electrically connected to the second sub-line, wherein a noise transfer path through which a noise applied to the first contact portion is transferred to the second contact portion is defined, and wherein the noise transfer path comprises a path passing through a third point of the rated voltage applied portion which electrically contacts the at least one first capacitor and a fourth point of the rated voltage applied portion which electrically contacts the at least one second capacitor.

14. A rated voltage transfer system, the system comprising:

a power net comprising a first power source which provides a first rated voltage;

a timing controller comprising a first block and a second block which are driven by the first rated voltage; and a rated voltage transfer line which electrically connects the first power source to each of the first block and the second block, wherein the rated voltage transfer line comprises:

a rated voltage applied portion receiving the first rated voltage from the first power source;

at least one capacitor comprising a first terminal connected to the rated voltage applied portion and a second terminal grounded;

a first rated voltage transfer electrode which electrically contacts the rated voltage applied portion at a first point;

a second rated voltage transfer electrode which electrically contacts the rated voltage applied portion at a second point different from the first point;

a first sub-line electrically connected to the first rated voltage transfer electrode; and a second sub-line electrically connected to the second rated voltage transfer electrode.

15. The system of claim 14, wherein the first point and the second point are spaced apart from each other by the at least one capacitor.

16. The system of claim 14, wherein the first sub-line and the second sub-line are spaced apart from each other.

17. The system of claim 14, the rated voltage transfer line further comprises:

a first contact portion electrically connected to the first sub-line and electrically connected to the first block; and a second contact portion electrically connected to the second sub-line and electrically connected to the second block.

18. The system of claim 17, wherein a noise transfer path through which a noise applied to the first contact portion is transferred to the second contact portion is defined, and wherein the noise transfer path comprises a path passing through a third point of the rated voltage applied portion which electrically contacts the at least one capacitor.

19. The system of claim 18, wherein the noise transfer path comprises:

a first noise transfer path in which the noise applied to the first contact portion is transferred to the rated voltage applied portion; and a second noise transfer path in which the noise is transferred from the rated voltage applied portion to the second contact portion, and wherein the noise is transferred to the second contact portion passing through the third point which electrically contacts the at least one capacitor in the second noise transfer path.

20. An electronic device comprising:

a power net comprising a first power source which provides a first rated voltage;

a timing controller comprising a first block and a second block which are driven by the first rated voltage;

a processor which transfers an image data signal and an input control signal to the timing controller; and a rated voltage transfer line which electrically connects the first power source to each of the first block and the second block, wherein the rated voltage transfer line comprises:

a rated voltage applied portion receiving the first rated voltage from the first power source;

at least one capacitor comprising a first terminal connected to the rated voltage applied portion and a second terminal grounded;

a first rated voltage transfer electrode which electrically contacts the rated voltage applied portion at a first point;

a second rated voltage transfer electrode which electrically contacts the rated voltage applied portion at a second point different from the first point;

a first sub-line electrically connected to the first rated voltage transfer electrode; and a second sub-line electrically connected to the second rated voltage transfer electrode.

* * * * *